(12) United States Patent
Hase

(10) Patent No.: US 7,999,640 B2
(45) Date of Patent: Aug. 16, 2011

(54) RF MODULE

(75) Inventor: Eiichi Hase, Iruma (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 273 days.

(21) Appl. No.: 12/366,933

(22) Filed: Feb. 6, 2009

(65) Prior Publication Data
US 2009/0206959 A1    Aug. 20, 2009

(30) Foreign Application Priority Data

Feb. 19, 2008    (JP) ................................. 2008-037810

(51) Int. Cl.
*H01P 1/00*    (2006.01)

(52) U.S. Cl. ....................................... 333/247; 333/245

(58) Field of Classification Search .................... 333/33, 333/245, 246, 247, 254, 260
See application file for complete search history.

(56) References Cited

U.S. PATENT DOCUMENTS
2008/0186112 A1    8/2008 Hase

OTHER PUBLICATIONS

60GHz-Band Flip-Chip MMIC Modules for IEEE1394 Wireless Adapters, K. Murahashi, et al.
RF and Microwave Packaging Technology, Dielectric Laboratories in Mar. 2003.

*Primary Examiner* — Stephen E Jones
(74) *Attorney, Agent, or Firm* — Brundidge & Stanger, P.C.

(57) ABSTRACT

In a radio-frequency wave module including a transmission path based on a distributed parameter element, the transmission path being part of an input/output terminal, a plurality of cavity-structured concave portions for containing semiconductor-including mounted components therein, grounding-use metallic electrodes, dielectric substrates of at least two or more layers, and semiconductors, electrical separation is established between the grounding-use metallic electrodes which form the transmission paths based on the distributed parameter element and at least one of the grounding-use metallic electrodes which are formed on bottom surfaces of the plurality of cavity-structured concave portions for containing the semiconductor-including mounted components therein.

4 Claims, 8 Drawing Sheets

RF MODULE

INCORPORATION BY REFERENCE

The present application claims priority from Japanese application JP2008-037810 filed on Feb. 19, 2008, the content of which is hereby incorporated by reference into this application.

CROSS-REFERENCE TO RELATED APPLICATIONS

The present application relates to the subject matter described in application Ser. No. 11/961,106 filed on Dec. 20, 2007, entitled "PACKAGE STRUCTURE FOR A HIGH-FREQUENCY ELECTRONIC COMPONENT" by Eiichi HASE and assigned to the assignee of the present application.

BACKGROUND OF THE INVENTION

The present invention relates to a radio-frequency wave module used in appliances such as, e.g., mobile wireless terminals and image transmission devices which are operated at the microwave band or higher.

In radio-frequency wave packages used for the appliances such as microwave-band-or-higher mobile wireless terminals and image transmission devices, small-sized implementation, hermetic-structure implementation, and radio-frequency wave implementation of the packages have become important factors from the viewpoints of their mountability and simplified implementation.

In the conventional radio-frequency wave packages used for the appliances such as microwave-band-or-higher mobile wireless terminals and image transmission devices, a first example which uses a metallic housing and a multilayered dielectric substrate is as follows: Namely, as is indicated in a catalog of Dielectric Laboratories in March 2003, i.e., Microwave Application Lab.: "RF and Microwave Packaging Technology" (Non-Patent Document 1), the multilayered dielectric substrate, on which a distributed parameter element based on a transmission path is formed, is deployed on the surface of the grounding-use metallic housing. In the structure of this first example, a concave portion in a cavity structure for containing semiconductor-including mounted components therein, and grounding-use metallic electrodes are provided on the multilayered dielectric substrate deployed on the surface of the grounding-use metallic housing. Moreover, the distributed parameter element based on the transmission path is formed up to the end surface of the concave portion in the cavity structure, thereby transmitting a radio-frequency wave signal to the semiconductor-including mounted components.

Similarly, a second example which uses the metallic housing and the multilayered dielectric substrate is as follows: Namely, as is indicated in the above-described Non-Patent Document 1, the multilayered dielectric substrate, on which the distributed parameter element based on the transmission path having the grounding-use metallic electrodes on the same surface is formed, is deployed on the surface of the grounding-use metallic housing. In the structure of this second example, the concave portion in the cavity structure for containing the semiconductor-including mounted components therein, and the grounding-use metallic electrodes are provided on the multilayered dielectric substrate deployed on the surface of the grounding-use metallic housing. Moreover, the distributed parameter element based on the transmission path having the grounding-use metallic electrodes on the same surface is formed up to the end surface of the concave portion in the cavity structure, thereby transmitting the radio-frequency wave signal to the semiconductor-including mounted components.

Similarly, a third example which uses only the multilayered dielectric substrate is as follows: Namely, as is indicated in 31st European Microwave Conference in 2001.: "60 GHz-Band Flip-Chip MMIC Modules for IEEE 1394 Wireless Adapters" (Non-Patent Document 2), a dielectric substrate, on which the distributed parameter element based on the transmission path having the grounding-use metallic electrodes on the same surface is formed, is deployed on the surface of the multilayered dielectric substrate on which the grounding-use metallic electrodes are deployed.

In the structure of this third example, the concave portion in the cavity structure for containing the semiconductor-including mounted components therein, and the grounding-use metallic electrodes are provided on the multilayered dielectric substrate deployed on the surface of the grounding-use metallic electrodes. Moreover, the distributed parameter element based on the transmission path having the grounding-use metallic electrodes on the same surface is formed up to the end surface of the concave portion in the cavity structure, thereby transmitting the radio-frequency wave signal to the semiconductor-including mounted components.

In these structures, there exist the following two advantages: Namely, one advantage is that, on account of the dielectric substrates on which the transmission-path-based distributed parameter element is formed, the radio-frequency wave signal can be propagated up to the end surface of the cavity-structured concave portion for containing the semiconductor-including mounted components therein, or up to the end surface of the cavity-structured hollow space for containing the semiconductor-including mounted components therein. Also, another advantage is that, on account of simplicity of the structure of the transmission-path-based distributed parameter element, the small-sized implementation of the packages can be accomplished.

SUMMARY OF THE INVENTION

In the first example indicated in the above-described conventional technologies, a two-layers-or-more dielectric substrate is used. Based on the dielectric substrate on which the transmission-path-based distributed parameter element is formed, the transmission-path-based distributed parameter element is formed which allows the radio-frequency wave signal to be propagated up to the end surface of the cavity-structured concave portion for containing the semiconductor-including mounted components therein, or up to the end surface of the cavity-structured hollow space for containing the semiconductor-including mounted components therein. In this structure, the transmission-path-based distributed parameter element is used which does not allow the grounding-use conductors to be formed on the same surface of the multilayered dielectric substrate. Accordingly, if there exist a plurality of cavity-structured concave portions for containing the semiconductor-including mounted components therein, the grounding-use metallic electrodes formed in the plurality of cavity-structured concave portions are required to be formed using metallic plates. This requirement is needed in order that the grounding for the semiconductor-including mounted components be made common to the mounted components. Consequently, it is difficult to form all the grounding-use metallic electrodes on the multilayered dielectric substrate.

In the second example indicated in the above-described conventional technologies, the two-layers-or-more dielectric substrate is used. Based on the grounding-use metallic electrodes provided on the same surface of the dielectric substrate and the dielectric substrate on which the transmission-path-based distributed parameter element is formed, the transmission-path-based distributed parameter element is formed which allows the radio-frequency wave signal to be propagated up to the end surface of the cavity-structured concave portion for containing the semiconductor-including mounted components therein, or up to the end surface of the cavity-structured hollow space for containing the semiconductor-including mounted components therein. On account of this, in the transmission-path-based distributed parameter element which allows the grounding-use conductors to be formed on the same surface of the dielectric substrate, if there exist a plurality of cavity-structured concave portions for containing the semiconductor-including mounted components therein, the grounding-use metallic electrodes formed in the plurality of cavity-structured concave portions are required to be formed using metallic plates. This requirement is needed in order that the above-described grounding-use metallic electrodes provided on the same surface of the dielectric substrate are connected to the grounding-use metallic electrodes formed in the plurality of cavity-structured concave portions, and that the grounding for the semiconductor-including mounted components be made common to the mounted components. Consequently, it is difficult to form all the grounding-use metallic electrodes on the multilayered dielectric substrate.

In the third example indicated in the above-described conventional technologies, the two-layers-or-more dielectric substrate is used. Based on the grounding-use metallic electrodes provided on the same surface of the dielectric substrate and the dielectric substrate on which the transmission-path-based distributed parameter element is formed, the transmission-path-based distributed parameter element is formed which allows the radio-frequency wave signal to be propagated up to the end surfaces of the semiconductor-including mounted components. On account of this, in the transmission-path-based distributed parameter element which allows the grounding-use conductors to be formed on the same surface of the dielectric substrate, if there exist the plurality of semiconductor-including mounted components for dealing with the radio-frequency wave signal, the grounding-use conductors provided on the same surface of the dielectric substrate are required to be connected to the grounding-use metallic electrodes deployed on the multilayered dielectric substrate. In this case, the grounding-use metallic electrodes, which are deployed on the multilayered dielectric substrate, and which are to be connected to the grounding-use metallic electrodes provided on the same surface of the dielectric substrate, are required to be further connected to a grounding-use metallic electrode which is deployed at the lowest portion, and which becomes common to the grounding-use metallic electrodes. It is difficult, however, that the semiconductor-including mounted components for dealing with the radio-frequency wave signal are directly connected to the grounding-use metallic electrode which is deployed at the lowest portion, and which becomes common to the grounding-use metallic electrodes.

FIG. 9 is a general structural schematic diagram of the following radio-frequency wave module: Using a four-layer dielectric substrate, a transmission-path-based distributed parameter element is formed which allows a radio-frequency wave signal to be propagated on the four-layer dielectric substrate. The radio-frequency wave signal can be propagated up to at least the end surfaces of a plurality of cavity-structured concave portions for containing semiconductor-including mounted components therein. Moreover, grounding-use metallic electrodes formed in the plurality of cavity structure's concave portions are connected to the module.

In FIG. 9, the radio-frequency wave module includes the following configuration components: A first-layer dielectric substrate 101, a second-layer dielectric substrate 102, a third-layer dielectric substrate 103, a fourth-layer dielectric substrate 104, metallic conductors 105 of the transmission-path-based distributed parameter element which are formed on the surface of the first-layer dielectric substrate 101 and through which a radio-frequency wave signal is propagated, a grounding-use metallic electrode 106 configuring the transmission-path-based distributed parameter element formed on the second-layer dielectric substrate 102, grounding-use metallic electrodes 107 and 108 formed on the third-layer dielectric substrate 103, grounding-use metallic electrodes 109, 110, 111, 112, and 113 formed on the fourth-layer dielectric substrate 104, a grounding-use metallic electrode 114 formed on the rear surface of the fourth-layer dielectric substrate 104, a plurality of cavity-structured concave portions 115 formed in the first-layer dielectric substrate 101, and semiconductor-including mounted components 116 which are to be contained into the plurality of cavity structure's concave portions 115.

DC-signal-use electrodes 117, 118, and 119 formed on the surface of the first-layer dielectric substrate 101 are connected to metallic electrodes 123, 124, and 125 formed on the rear surface of the fourth-layer dielectric substrate 104 via electrically-conductive through-holes formed on the second-layer dielectric substrate 102 and the fourth-layer dielectric substrate 104 and wiring-use metallic electrodes 120 and 121 formed on the third-layer dielectric substrate 103 and a wiring-use metallic electrode 122 formed on the fourth-layer dielectric substrate 104. DC-signal-use electrodes 126, 127, and 128 formed on the surface of the first-layer dielectric substrate 101 are connected to metallic electrodes 129, 130, and 131 formed on the rear surface of the fourth-layer dielectric substrate 104 via the electrically-conductive through-holes formed on the second-layer dielectric substrate 102, the third-layer dielectric substrate 103, and the fourth-layer dielectric substrate 104.

Also, bypass capacitors 132 deployed on the first-layer dielectric substrate 101 are connected to grounding-use metallic electrodes 133 formed on the surface of the first-layer dielectric substrate 101. The bypass capacitors 132, then, are connected to the grounding-use metallic electrode 106 formed on the second-layer dielectric substrate 102, the grounding-use metallic electrodes 107 and 108 formed on the third-layer dielectric substrate 103, the grounding-use metallic electrode 109 formed on the fourth-layer dielectric substrate 104, and the grounding-use metallic electrode 114 formed on the rear surface of the fourth-layer dielectric substrate 104 via the electrically-conductive through-holes formed on the second-layer dielectric substrate 102, the third-layer dielectric substrate 103, and the fourth-layer dielectric substrate 104.

Moreover, the metallic conductors 105 of the transmission-path-based distributed parameter element, which are formed on the surface of the first-layer dielectric substrate 101 and through which the radio-frequency wave signal is propagated, are connected to metallic electrodes 134 and 135 formed on the rear surface of the fourth-layer dielectric substrate 104 via the electrically-conductive through-holes formed on the second-layer dielectric substrate 102, the third-layer dielectric substrate 103, and the fourth-layer dielectric substrate 104. As a result, the metallic conductors 105 are formed into a structure of being able to be connected to the outside. The semiconductor-including mounted components 116 which are to be contained into the plurality of cavity-structured concave portions 115 formed in the first-layer dielectric substrate 101 are connected to the grounding-use metallic electrode 106 formed on the second-layer dielectric substrate 102. A large number of electrically-conductive through-holes 136 are formed directly below the semiconductor-including mounted components 116. Via these large number of electrically-conductive through-holes 136, the semiconductor-including mounted components 116 are connected to the grounding-use metallic electrodes 107 and 108 formed on the third-layer dielectric substrate 103, the grounding-use metallic electrode 109 formed on the fourth-layer dielectric substrate 104, and the grounding-use metallic electrode 114 formed on the rear surface of the fourth-layer dielectric substrate 104.

In the structure illustrated in FIG. 9, there exist the following two advantages: Namely, one advantage is that, on account of the metallic conductors 105 on the first-layer dielectric substrate 101 which form the transmission-path-based distributed parameter element, and the grounding-use metallic electrode 106 formed on the second-layer dielectric substrate 102, the radio-frequency wave signal can be propagated up to the end surfaces of the plurality of cavity-structured concave portions 115 for containing the semiconductor-including mounted components 116 therein. Also, another advantage is that, on account of the simplicity of the structure of the transmission-path-based distributed parameter element, the small-sized implementation of the packages can be accomplished. Despite these advantages, however, a small inductance remains between the grounding-use metallic electrode 114 formed on the rear surface of the fourth-layer dielectric substrate 104, and the semiconductor-including mounted components 116. This remaining small inductance, in some cases, gives rise to an increase in the resonance or an increase in the loss of the radio-frequency wave signal. The reason for this remaining of the small inductance is as follows: The grounding-use metallic electrode 106, which is formed directly below the plurality of cavity-structured concave portions 115 for containing the semiconductor-including mounted components 116 therein, is connected to the grounding-use metallic electrodes 107 and 108 formed on the third-layer dielectric substrate 103, the grounding-use metallic electrode 109 formed on the fourth-layer dielectric substrate 104, and the grounding-use metallic electrode 114 formed on the rear surface of the fourth-layer dielectric substrate 104 via the large number of electrically-conductive through-holes 136.

FIG. 10 is a cross-sectional schematic diagram of FIG. 9, i.e., the general example of the radio-frequency wave module according to the conventional technologies.

In FIG. 10, the radio-frequency wave module includes the following configuration components: The first-layer dielectric substrate 101, the second-layer dielectric substrate 102, the third-layer dielectric substrate 103, the fourth-layer dielectric substrate 104, the metallic conductors 105 of the transmission-path-based distributed parameter element which are formed on the surface of the first-layer dielectric substrate 101 and through which the radio-frequency wave signal is propagated, the grounding-use metallic electrode 106 configuring the transmission-path-based distributed parameter element formed on the second-layer dielectric substrate 102, the grounding-use metallic electrodes 107 and 108 formed on the third-layer dielectric substrate 103, the grounding-use metallic electrode 109 formed on the fourth-layer dielectric substrate 104, the grounding-use metallic electrode 114 formed on the rear surface of the fourth-layer dielectric substrate 104, the semiconductor-including mounted components 116 which are to be contained into the plurality of cavity structure's concave portions 115 formed in the first-layer dielectric substrate 101, the wiring-use metallic electrodes 120 and 121 formed on the third-layer dielectric substrate 103, and the wiring-use metallic electrode 122 formed on the fourth-layer dielectric substrate 104. The metallic conductors 105 of the transmission-path-based distributed parameter element, which are formed on the surface of the first-layer dielectric substrate 101 and through which the radio-frequency wave signal is propagated, are connected to the metallic electrodes 134 and 135 formed on the rear surface of the fourth-layer dielectric substrate 104 via the electrically-conductive through-holes formed on the second-layer dielectric substrate 102, the third-layer dielectric substrate 103, and the fourth-layer dielectric substrate 104. As a result, the metallic conductors 105 are formed into the structure of being able to be connected to the outside.

FIG. 11 is a diagram where a curve 1 indicates the transmission characteristics between A-B, a curve 2 indicates the input-side reflection characteristics therebetween, and a curve 3 indicates the output-side reflection characteristics therebetween in FIG. 9, i.e., the general example of the radio-frequency wave module according to the conventional technologies, at the time when set-up values for the configuration components of the radio-frequency wave module are given as follows: Relative dielectric constant and thickness of the first-layer dielectric substrate 101, the second-layer dielectric substrate 102, the third-layer dielectric substrate 103, and the fourth-layer dielectric substrate 104 are 5.6 and 0.15 mm respectively, metallic-conductor width of the metallic conductors 105 of the transmission-path-based distributed parameter element is 0.22 mm, metallic-conductor width of the DC-signal-use electrodes 117, 118, 119, 126, 127, and 128 formed on the surface of the first-layer dielectric substrate 101 is 1.2 mm, metallic-conductor width of the wiring-use metallic electrodes 120 and 121 formed on the third-layer dielectric substrate 103 and the wiring-use metallic electrode 122 formed on the fourth-layer dielectric substrate 104 is 1.2 mm, diameter of the electrically-conductive through-holes connected to the metallic electrodes 123, 124, and 125 formed on the rear surface of the fourth-layer dielectric substrate 104 by way of the DC-signal-use electrodes 117, 118, and 119 formed on the surface of the first-layer dielectric substrate 101, the wiring-use metallic electrodes 120 and 121 formed on the third-layer dielectric substrate 103, and the wiring-use metallic electrode 122 formed on the fourth-layer dielectric substrate 104 is 0.2 mm, diameter of the electrically-conductive through-holes connected to the DC-signal-use electrodes 126, 127, and 128 formed on the surface of the first-layer dielectric substrate 101 and the metallic electrodes 129, 130, and 131 formed on the rear surface of the fourth-layer dielectric substrate 104 is 0.2 mm, diameter of the large number of electrically-conductive through-holes 136 which connect the grounding-use metallic electrode 106 formed on the second-layer dielectric substrate 102, the grounding-use metallic electrodes 107 and 108 formed on the third-layer dielectric substrate 103, the grounding-use metallic electrode 109 formed on the fourth-layer dielectric substrate 104, and the grounding-use metallic electrode 114 formed on the rear surface of the fourth-layer dielectric substrate 104 is 0.2 mm, the plurality of cavity-structured concave portions 115 formed in the first-layer dielectric substrate 101 for containing the semiconductor-including mounted components 116 therein is 2.8×2.2 mm, the diameter of the large number of electrically-conductive conductive through-holes formed directly below the semiconductor-including mounted components 116 is 0.2 mm, and the semiconductor-including mounted components 116 are commercially-available amplification-use monolithic ICs.

In FIG. 11, the transmission characteristics in the curve 1 exhibit steep increases at frequencies of 14 GHz and 20 GHz, and exhibit a variation of about 11 dB in a range of 3 GHz to 20 GHz. The output-side reflection characteristics in the curve 3 exhibit a steep degradation at a frequency of 20 GHz. This characteristics data indicates that the operation of the module has become unstable.

The present invention has been made in view of the above-described circumstances. Accordingly, an object of the present invention is to provide a radio-frequency wave module whose structure is converted into a structure which will not result in the increase in the resonance or the increase in the loss of the radio-frequency wave signal. This structure is successfully implemented by establishing electrical separation between the grounding-use metallic electrodes, which each form the transmission path based on the distributed parameter element and at least one of the grounding-use metallic electrodes formed on the bottom surfaces of the plurality of cavity-structured concave portions for containing the semiconductor-including mounted components therein.

In order to accomplish the above-described object, in the present invention, there is provided a radio-frequency wave module including a transmission path based on a distributed parameter element, the transmission path being designed as part of an input/output terminal, a plurality of cavity-structured concave portions for containing semiconductor-including mounted components therein, grounding-use metallic electrodes, a dielectric substrate of at least two or more layers, and a semiconductor, wherein electrical separation is established between the grounding-use metallic electrode which forms the transmission path based on the distributed parameter element, and at least the one or more grounding-use metallic electrodes which are formed on bottom surfaces of the plurality of cavity-structured concave portions for containing the semiconductor-including mounted components therein.

Also, in the present invention, there is provided a radio-frequency wave module including a transmission path based on a distributed parameter element, the transmission path being designed as part of an input/output terminal, a plurality of cavity-structured concave portions for containing semiconductor-including mounted components therein, grounding-use metallic electrodes, a dielectric substrate of at least two or more layers, the distributed parameter element based on the transmission path, and a semiconductor having a matching circuit, the matching circuit including a lumped parameter element of a resistor, a capacitor, and an inductor, wherein electrical separation is established between the grounding-use metallic electrode which forms the distributed parameter element based on the transmission path and the matching circuit and at least the one or more grounding-use metallic electrodes which are formed on bottom surfaces of the plurality of cavity-structured concave portions for containing the semiconductor-including mounted components therein, the matching circuit including the lumped parameter element of the resistor, the capacitor, and the inductor.

With respect to the radio-frequency wave module of the present invention, in a radio-frequency wave package of the radio-frequency wave module including the transmission path based on the distributed parameter element, the transmission path being designed as the part of the input/output terminal, the plurality of cavity-structured concave portions for containing the semiconductor-including mounted components therein, the grounding-use metallic electrodes, and the dielectric substrate of at least the two or more layers, the structure is employed where the electrical separation is established between the grounding-use metallic electrode which forms the transmission path based on the distributed parameter element, and at least the one or more grounding-use metallic electrodes which are formed on the bottom surfaces of the plurality of cavity-structured concave portions for containing the semiconductor-including mounted components therein. Otherwise, in a radio-frequency wave package of the radio-frequency wave module including the transmission path based on the distributed parameter element, the transmission path being designed as the part of the input/output terminal, the plurality of cavity-structured concave portions for containing the semiconductor-including mounted components therein, the grounding-use metallic electrodes, and the dielectric substrate of at least the two or more layers, a structure is employed where the electrical separation is established between the grounding-use metallic electrode which forms the transmission path based on the distributed parameter element, and all of the grounding-use metallic electrodes which are formed on the bottom surfaces of the plurality of cavity structure's concave portions for containing the semiconductor-including mounted components therein. On account of the employments of these structures, in the radio-frequency wave package of the radio-frequency wave module including the transmission path based on the distributed parameter element, the transmission path being designed as the part of the input/output terminal, the plurality of cavity-structured concave portions for containing the semiconductor-including mounted components therein, the grounding-use metallic electrodes, and the dielectric substrate of at least the two or more layers, even if the grounding-use metallic electrodes provided on the respective surfaces and the rear surface of the dielectric substrate of at least the two or more layers are connected to each other via the electrically-conductive through-holes, the component of the radio-frequency wave signal in the semiconductor-including mounted components, which flows through the grounding-use metallic electrodes formed on the bottom surfaces of the plurality of cavity-structured concave portions for containing the semiconductor-including mounted components therein, ceases to flow through the grounding-use metallic electrodes provided on the respective surfaces of the dielectric substrate. As a consequence, the structure of the radio-frequency wave module can be converted into the structure which will not give rise to the increase in the resonance or the increase in the loss of the radio-frequency wave signal, and which is unlikely to cause the steep variation to occur in the frequency characteristics of the radio-frequency wave module.

Furthermore, in the present invention, glass or ceramics is employed as the material of the dielectric substrate. This employment of glass or ceramics makes it easier to form the hermetic structure by hermetically sealing the package such that a dielectric substrate having a hollow space provided by removing part of the dielectric substrate is bonded on the top portion thereof.

Other objects, features and advantages of the invention will become apparent from the following description of the embodiments of the invention taken in conjunction with the accompanying drawings.

DETAILED DESCRIPTION OF THE INVENTION

Figure 1:
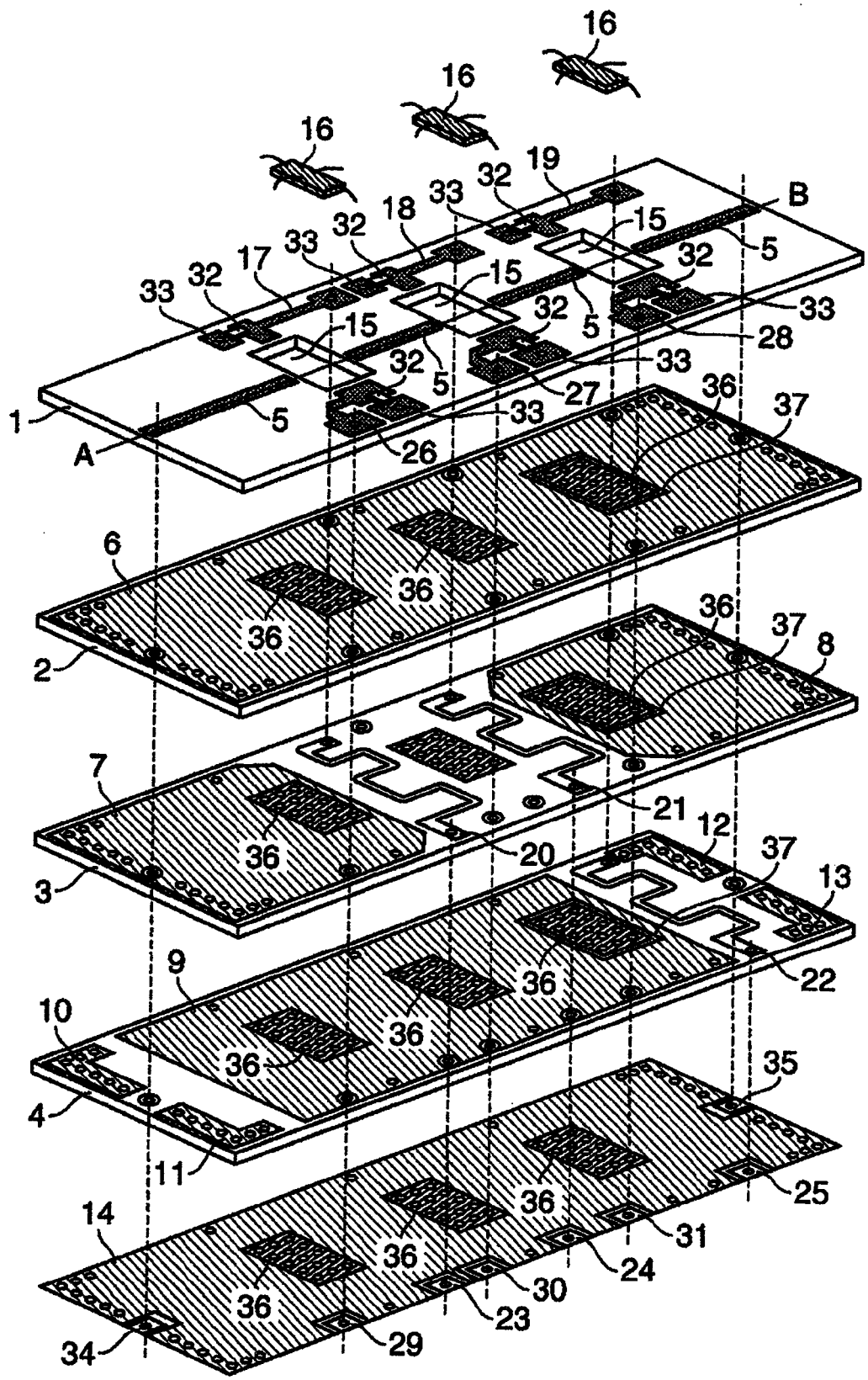
FIG. 1 is an exploded perspective diagram for illustrating a radio-frequency wave module according to a first embodiment of the present invention.

Hereinafter, referring to the drawings, the detailed explanation will be given below concerning embodiments of the present invention.

First, the detailed explanation will be given below regarding a first embodiment of the present invention. FIG. 1 is a structural diagram of a radio-frequency wave module to which the present invention is applied. In FIG. 1, using a four-layer dielectric substrate, the radio-frequency wave module includes the following configuration components: A first-layer dielectric substrate 1, a second-layer dielectric substrate 2, a third-layer dielectric substrate 3, a fourth-layer dielectric substrate 4, metallic conductors 5 of a transmission-path-based distributed parameter element which are formed on the surface of the first-layer dielectric substrate 1 and through which a radio-frequency wave signal is propagated, a grounding-use metallic electrode 6 configuring a transmission-path-based distributed parameter element formed on the second-layer dielectric substrate 2, grounding-use metallic electrodes 7 and 8 formed on the third-layer dielectric substrate 3, grounding-use metallic electrodes 9, 10, 11, 12, and 13 formed on the fourth-layer dielectric substrate 4, a grounding-use metallic electrode 14 formed on the rear surface of the fourth-layer dielectric substrate 4, a plurality of cavity-structured concave portions 15 formed in the first-layer dielectric substrate 1, and semiconductor-including mounted components 16 which are to be contained into the plurality of cavity-structured concave portions 15.

DC-signal-use electrodes 17, 18, and 19 formed on the surface of the first-layer dielectric substrate 1 are connected to metallic electrodes 23, 24, and 25 formed on the rear surface of the fourth-layer dielectric substrate 4 via electrically-conductive through-holes formed on the second-layer dielectric substrate 2 and the fourth-layer dielectric substrate 4 and wiring-use metallic electrodes 20 and 21 formed on the third-layer dielectric substrate 3 and a wiring-use metallic electrode 22 formed on the fourth-layer dielectric substrate 4. DC-signal-use electrodes 26, 27, and 28 formed on the surface of the first-layer dielectric substrate 1 are connected to metallic electrodes 29, 30, and 31 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Also, bypass capacitors 32 configured with chip capacitors and deployed on the first-layer dielectric substrate 1 are connected to grounding-use metallic electrodes 33 formed on the surface of the first-layer dielectric substrate 1. The bypass capacitors 32, then, are connected to the grounding-use metallic electrode 6 formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, and the grounding-use metallic electrode 14 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Moreover, the metallic conductors 5 of the transmission-path-based distributed parameter element, which are formed on the surface of the first-layer dielectric substrate 1 and through which the radio-frequency wave signal is propagated, are connected to metallic electrodes 34 and 35 formed on the rear surface of the fourth-layer dielectric substrate 4 via the electrically-conductive through-holes formed in the second-layer dielectric substrate 2, the third-layer dielectric substrate 3, and the fourth-layer dielectric substrate 4. As a result, the metallic conductors 5 are formed into an input/output terminal structure of being able to be connected to the outside.

Part of the semiconductor-including mounted components 16 which are to be contained into the plurality of cavity-structured concave portions 15 formed in the first-layer dielectric substrate 1 is connected to the grounding-use metallic electrode 6 formed on the second-layer dielectric substrate 2. A large number of electrically-conductive through-holes 36 are formed directly below the semiconductor-including mounted components 16. Via these large number of electrically-conductive through-holes 36, the part of the semiconductor-including mounted components 16 is connected to the grounding-use metallic electrode 7 formed on the third-layer dielectric substrate 3, the grounding-use metallic electrode 9 formed on the fourth-layer dielectric substrate 4, and the grounding-use metallic electrode 14 formed on the rear surface of the fourth-layer dielectric substrate 4.

Here, via the large number of electrically-conductive through-holes 36 formed in the second-layer dielectric substrate 2, the third-layer dielectric substrate 3, and the fourth-layer dielectric substrate 4, the semiconductor-including mounted components 16 which are to be contained into the plurality of cavity-structured concave portions 15 formed in the first-layer dielectric substrate 1 is directly connected to the grounding-use metallic electrode 14 formed on the rear surface of the fourth-layer dielectric substrate 4. However, on account of hollow gaps 37 having a predetermined width and formed in the second-layer dielectric substrate 2, the third-layer dielectric substrate 3, and the fourth-layer dielectric substrate 4, one of the semiconductor-including mounted components 16 which are to be contained into the plurality of cavity structure's concave portions 15 formed in the first-layer dielectric substrate 1 is not connected to the grounding-use metallic electrode 6 formed on the second-layer dielectric substrate 2, the grounding-use metallic electrode 8 formed on the third-layer dielectric substrate 3, and the grounding-use metallic electrode 9 formed on the fourth-layer dielectric substrate 4.

In FIG. 1, set-up values for the configuration components of the radio-frequency wave module are given as follows: Relative dielectric constant and thickness of the first-layer dielectric substrate 1, the second-layer dielectric substrate 2, the third-layer dielectric substrate 3, and the fourth-layer dielectric substrate 4 are 5.6 and 0.15 mm respectively, metallic-conductor width of the metallic conductors 5 of the transmission-path-based distributed parameter element is 0.22 mm, metallic-conductor width of the DC-signal-use electrodes 17, 18, 19, 26, 27, and 28 formed on the surface of the first-layer dielectric substrate 101 is 1.2 mm, metallic-conductor width of the wiring-use metallic electrodes 20 and 21 formed on the third-layer dielectric substrate 3 and the wiring-use metallic electrode 22 formed on the fourth-layer dielectric substrate 4 is 1.2 mm, diameter of the electrically-conductive through-holes connected to the metallic electrodes 23, 24, and 25 formed on the rear surface of the fourth-layer dielectric substrate 4 by way of the DC-signal-use electrodes 17, 18, and 19 formed on the surface of the first-layer dielectric substrate 1, the wiring-use metallic electrodes 20 and 21 formed on the third-layer dielectric substrate 3, and the wiring-use metallic electrode 22 formed on the fourth-layer dielectric substrate 4 is 0.2 mm, diameter of the electrically-conductive through-holes connected to the DC-signal-use electrodes 26, 27, and 28 formed on the surface of the first-layer dielectric substrate 1 and the metallic electrodes 29, 30, and 31 formed on the rear surface of the fourth-layer dielectric substrate 4 is 0.2 mm, diameter of the large number of electrically-conductive through-holes which connect the grounding-use metallic electrode 6 configuring the transmission-path-based distributed parameter element and formed on the second-layer dielectric substrate 2, the grounding-use metallic electrode 7 formed on the third-layer dielectric substrate 3, the grounding-use metallic electrode 9 formed on the fourth-layer dielectric substrate 4, and the grounding-use metallic electrode 14 formed on the rear surface of the fourth-layer dielectric substrate 4 is 0.2 mm, and the plurality of cavity-structured concave portions 15 formed in the first-layer dielectric substrate 1 for containing the semiconductor-including mounted components 16 therein is 2.8×2.2 mm.

The grounding-use metallic electrode formed on the bottom surface of one of the semiconductor-including mounted components 16 which are to be contained into the plurality of cavity-structured concave portions 15 formed in the first-layer dielectric substrate 1 is electrically separated by the hollow gaps 37 having 0.2 mm width, so that the grounding-use metallic electrode is not connected to the grounding-use metallic electrode 6 formed on the second-layer dielectric substrate 2, the grounding-use metallic electrodes 7 and 8 formed on the third-layer dielectric substrate 3, and the grounding-use metallic electrode 9 formed on the fourth-layer dielectric substrate 4.

Figure 2:
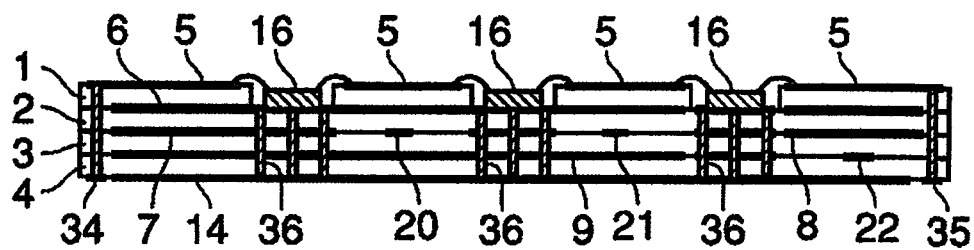
FIG. 2 is a cross-sectional diagram for illustrating the radio-frequency wave module according to the first embodiment of the present invention.

FIG. 2 is a cross-sectional schematic diagram of FIG. 1, i.e., the first embodiment of the radio-frequency wave module to which the present invention is applied.

In FIG. 2, the radio-frequency wave module includes the following configuration components: The first-layer dielectric substrate 1, the second-layer dielectric substrate 2, the third-layer dielectric substrate 3, the fourth-layer dielectric substrate 4, the metallic conductors 5 of the transmission-path-based distributed parameter element which are formed on the surface of the first-layer dielectric substrate 1 and through which the radio-frequency wave signal is propagated, the grounding-use metallic electrode 6 configuring the transmission-path-based distributed parameter element formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, the grounding-use metallic electrode 14 formed on the rear surface of the fourth-layer dielectric substrate 4, the semiconductor-including mounted components 16 which are to be contained into the plurality of cavity-structured concave portions 15 formed in the first-layer dielectric substrate 1, the wiring-use metallic electrodes 20 and 21 formed on the third-layer dielectric substrate 3, and the wiring-use metallic electrode 22 formed on the fourth-layer dielectric substrate 4. The metallic conductors 5 of the transmission-path-based distributed parameter element, which are formed on the surface of the first-layer dielectric substrate 1 and through which the radio-frequency wave signal is propagated, are connected to the metallic electrodes 34 and 35 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4. As a result, the metallic conductors 5 are formed into the structure of being able to be connected to the outside.

In the first embodiment of the present invention, the four-layer-structured dielectric substrate has been formed in the following manner: The second-layer dielectric substrate 2 on which the grounding-use metallic electrode 6 is formed, the third-layer dielectric substrate 3 on which the wiring-use metallic electrodes 20 and 21 are formed, and the fourth-layer dielectric substrate 4 on which the wiring-use metallic electrode 22 is formed are overlapped with each other under the first-layer dielectric substrate 1 in which the plurality of cavity-structured concave portions 15 are formed, and the grounding-use metallic electrode 14 is formed on the rear surface of the fourth-layer dielectric substrate 4. The layer number of the dielectric substrate, however, is not specifically limited to a particular number such as four.

Figure 3:
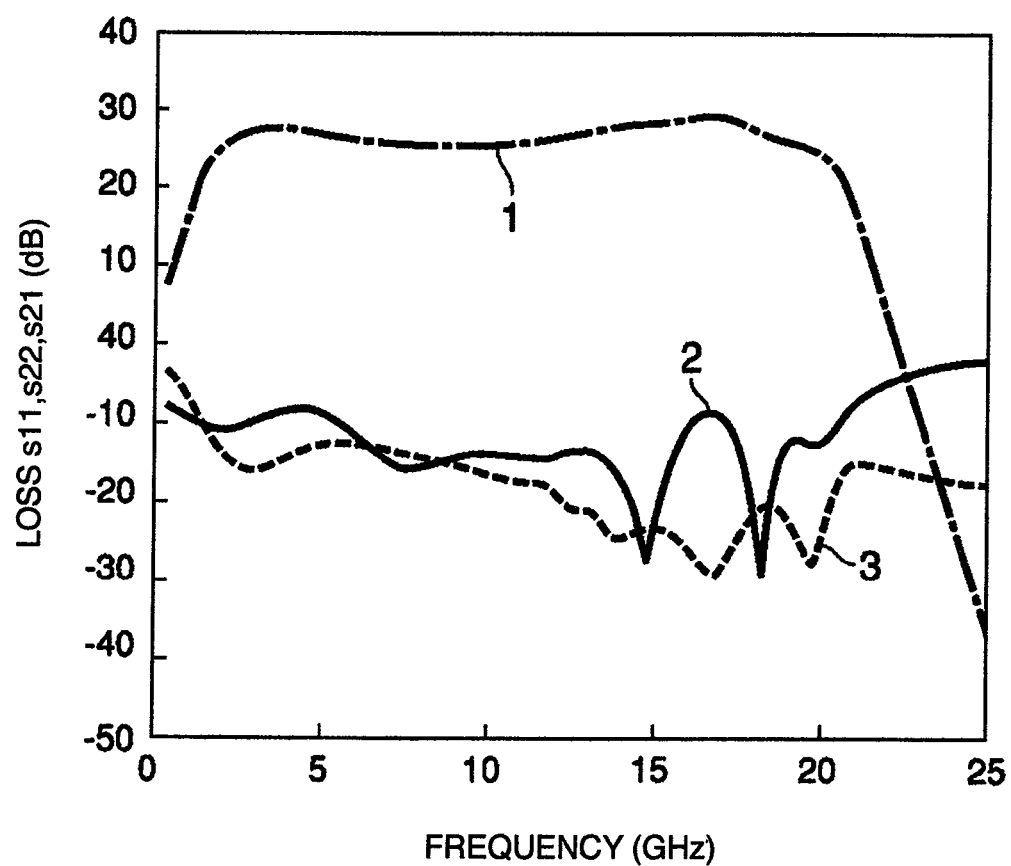
FIG. 3 is a characteristics curve diagram for illustrating transmission characteristics of the radio-frequency wave module according to the first embodiment of the present invention.

FIG. 3 is a diagram where a curve 1 indicates the transmission characteristics between A-B, a curve 2 indicates the input-side reflection characteristics therebetween, and a curve 3 indicates the output-side reflection characteristics therebetween in FIG. 1, i.e., the first embodiment of the radio-frequency wave module to which the present invention is applied. In FIG. 3, the transmission characteristics in the curve 1 exhibit no steep increases in the range of 3 GHz to 20 GHz, and exhibit only a variation of about 4 dB or smaller therein. The input-side reflection characteristics in the curve 2 and the output-side reflection characteristics in the curve 3 also exhibit no steep degradations in the range of 3 GHz to 20 GHz. This characteristics data indicates that the module is in a stable operation.

Figure 4:
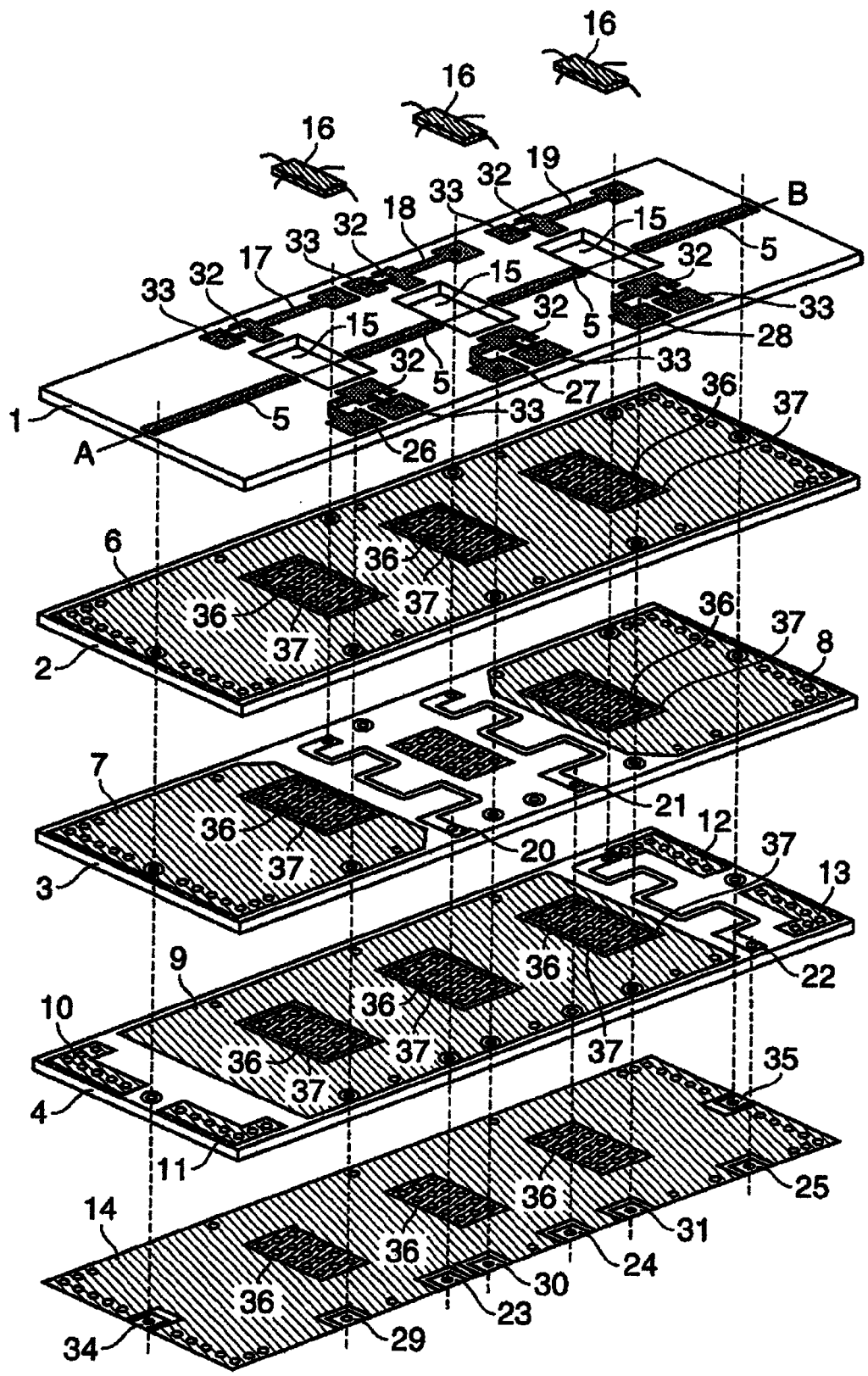
FIG. 4 is an exploded perspective diagram for illustrating a radio-frequency wave module according to a second embodiment of the present invention.

Next, the detailed explanation will be given below concerning a second embodiment of the present invention. FIG. 4 is a structural diagram of a radio-frequency wave module to which the present invention is applied. In FIG. 4, using a four-layer dielectric substrate, the radio-frequency wave module includes the following configuration components: A first-layer dielectric substrate 1, a second-layer dielectric substrate 2, a third-layer dielectric substrate 3, a fourth-layer dielectric substrate 4, metallic conductors 5 of a transmission-path-based distributed parameter element which are formed on the surface of the first-layer dielectric substrate 1 and through which a radio-frequency wave signal is propagated, a grounding-use metallic electrode 6 configuring a transmission-path-based distributed parameter element formed on the second-layer dielectric substrate 2, grounding-use metallic electrodes 7 and 8 formed on the third-layer dielectric substrate 3, grounding-use metallic electrodes 9, 10, 11, 12, and 13 formed on the fourth-layer dielectric substrate 4, a grounding-use metallic electrode 14 formed on the rear surface of the fourth-layer dielectric substrate 4, a plurality of cavity-structured concave portions 15 formed in the first-layer dielectric substrate 1, and semiconductor-including mounted components 16 which are to be contained into the plurality of cavity-structured concave portions 15.

DC-signal-use electrodes 17, 18, and 19 formed on the surface of the first-layer dielectric substrate 1 are connected to metallic electrodes 23, 24, and 25 formed on the rear surface of the fourth-layer dielectric substrate 4 via electrically-conductive through-holes formed on the second-layer dielectric substrate 2 and the fourth-layer dielectric substrate 4 and wiring-use metallic electrodes 20 and 21 formed on the third-layer dielectric substrate 3 and a wiring-use metallic electrode 22 formed on the fourth-layer dielectric substrate 4. DC-signal-use electrodes 26, 27, and 28 formed on the surface of the first-layer dielectric substrate 1 are connected to metallic electrodes 29, 30, and 31 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Also, bypass capacitors 32 configured with chip capacitors and deployed on the first-layer dielectric substrate 1 are connected to grounding-use metallic electrodes 33 formed on the surface of the first-layer dielectric substrate 1. The bypass capacitors 32, then, are connected to the grounding-use metallic electrode 6 formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, and the grounding-use metallic electrode 14 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Moreover, the metallic conductors 5 of the transmission-path-based distributed parameter element, which are formed on the surface of the first-layer dielectric substrate 1 and through which the radio-frequency wave signal is propagated, are connected to metallic electrodes 34 and 35 formed on the rear surface of the fourth-layer dielectric substrate 4 via the electrically-conductive through-holes formed in the second-layer dielectric substrate 2, the third-layer dielectric substrate 3, and the fourth-layer dielectric substrate 4. As a result, the metallic conductors 5 are formed into an input/output terminal structure capable of being connected to the outside.

Here, via the large number of electrically-conductive through-holes 36 formed in the second-layer dielectric substrate 2, the third-layer dielectric substrate 3, and the fourth-layer dielectric substrate 4, the semiconductor-including mounted components 16 which are to be contained into the plurality of cavity-structured concave portions 15 formed in the first-layer dielectric substrate 1 are directly connected to the grounding-use metallic electrode 14 formed on the rear surface of the fourth-layer dielectric substrate 4. However, on account of hollow gaps 37 having a predetermined width and formed in the second-layer dielectric substrate 2, the third-layer dielectric substrate 3, and the fourth-layer dielectric substrate 4, the semiconductor-including mounted components 16 which are to be contained into the plurality of cavity-structured concave portions 15 formed in the first-layer dielectric substrate 1 are not connected to the grounding-use metallic electrode 6 formed on the second-layer dielectric substrate 2, the grounding-use metallic electrodes 7 and 8 formed on the third-layer dielectric substrate 3, and the grounding-use metallic electrode 9 formed on the fourth-layer dielectric substrate 4.

In FIG. 4, set-up values for the configuration components of the radio-frequency wave module are given as follows: Relative dielectric constant and thickness of the first-layer dielectric substrate 1, the second-layer dielectric substrate 2, the third-layer dielectric substrate 3, and the fourth-layer dielectric substrate 4 are 5.6 and 0.15 mm respectively, metallic-conductor width of the metallic conductors 5 of the transmission-path-based distributed parameter element is 0.22 mm, metallic-conductor width of the DC-signal-use electrodes 17, 18, 19, 26, 27, and 28 formed on the surface of the first-layer dielectric substrate 101 is 1.2 mm, metallic-conductor width of the wiring-use metallic electrodes 20 and 21 formed on the third-layer dielectric substrate 3 and the wiring-use metallic electrode 22 formed on the fourth-layer dielectric substrate 4 is 1.2 mm, diameter of the electrically-conductive through-holes connected to the metallic electrodes 23, 24, and 25 formed on the rear surface of the fourth-layer dielectric substrate 4 by way of the DC-signal-use electrodes 17, 18, and 19 formed on the surface of the first-layer dielectric substrate 1, the wiring-use metallic electrodes 20 and 21 formed on the third-layer dielectric substrate 3, and the wiring-use metallic electrode 22 formed on the fourth-layer dielectric substrate 4 is 0.2 mm, diameter of the electrically-conductive through-holes connected to the DC-signal-use electrodes 26, 27, and 28 formed on the surface of the first-layer dielectric substrate 1 and the metallic electrodes 29, 30, and 31 formed on the rear surface of the fourth-layer dielectric substrate 4 is 0.2 mm, diameter of the electrically-conductive through-holes which connect the grounding-use metallic electrode 6 configuring the transmission-path-based distributed parameter element and formed on the second-layer dielectric substrate 2, the grounding-use metallic electrodes 7 and 8 formed on the third-layer dielectric substrate 3, the grounding-use metallic electrodes 9, 10, 11, 12, and 13 formed on the fourth-layer dielectric substrate 4, and the grounding-use metallic electrode 14 formed on the rear surface of the fourth-layer dielectric substrate 4 is 0.2 mm, and the plurality of cavity-structured concave portions 15 formed in the first-layer dielectric substrate 1 for containing the semiconductor-including mounted components 16 therein is 2.8× 2.2 mm.

The grounding-use metallic electrodes formed on the bottom surfaces of the semiconductor-including mounted components 16 which are to be contained into the plurality of cavity-structured concave portions 15 formed in the first-layer dielectric substrate 1 are electrically separated by the above-described hollow gaps 37 having the predetermined width of 0.2 mm, so that the grounding-use metallic electrodes are not connected to the grounding-use metallic electrode 6 formed on the second-layer dielectric substrate 2, the grounding-use metallic electrodes 7 and 8 formed on the third-layer dielectric substrate 3, and the grounding-use metallic electrode 9 formed on the fourth-layer dielectric substrate 4.

Figure 5:
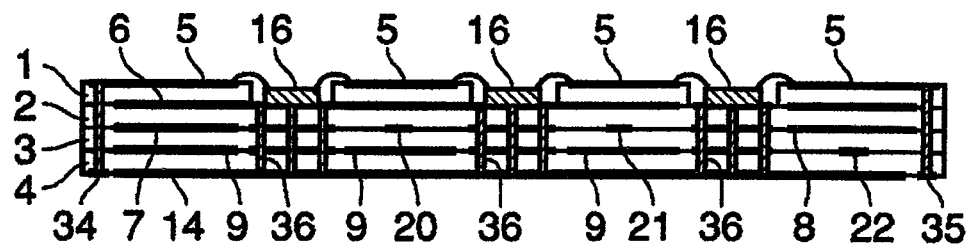
FIG. 5 is a cross-sectional diagram for illustrating the radio-frequency wave module according to the second embodiment of the present invention.

FIG. 5 is a cross-sectional schematic diagram of FIG. 4, i.e., the second embodiment of the radio-frequency wave module to which the present invention is applied.

In FIG. 5, the radio-frequency wave module includes the following configuration components: The first-layer dielectric substrate 1, the second-layer dielectric substrate 2, the third-layer dielectric substrate 3, the fourth-layer dielectric substrate 4, the metallic conductors 5 of the transmission-path-based distributed parameter element which are formed on the surface of the first-layer dielectric substrate 1 and through which the radio-frequency wave signal is propagated, the grounding-use metallic electrode 6 configuring the transmission-path-based distributed parameter element formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, the grounding-use metallic electrode 14 formed on the rear surface of the fourth-layer dielectric substrate 4, the plurality of cavity-structured concave portions 15 formed in the first-layer dielectric substrate 1, the semiconductor-including mounted components 16 which are to be contained into the plurality of cavity-structured concave portions 15, the wiring-use metallic electrodes 20 and 21 formed on the third-layer dielectric substrate 3, and the wiring-use metallic electrode 22 formed on the fourth-layer dielectric substrate 4. The metallic conductors 5 of the transmission-path-based distributed parameter element, which are formed on the surface of the first-layer dielectric substrate 1 and through which the radio-frequency wave signal is propagated, are connected to the metallic electrodes 34 and 35 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4. As a result, the metallic conductors 5 are formed into the input/output terminal structure capable of being connected to the outside.

In the second embodiment of the present invention, the four-layer-structured dielectric substrate has been formed in the following manner: The second-layer dielectric substrate 2 on which the grounding-use metallic electrode 6 is formed, the third-layer dielectric substrate 3 on which the wiring-use metallic electrodes 20 and 21 are formed, and the fourth-layer dielectric substrate 4 on which the wiring-use metallic electrode 22 is formed are overlapped with each other under the first-layer dielectric substrate 1 in which the plurality of cavity-structured concave portions 15 are formed, and the grounding-use metallic electrode 14 is formed on the rear surface of the fourth-layer dielectric substrate 4. The layer number of the dielectric substrate, however, is not specifically limited to a particular number such as four.

Figure 6:
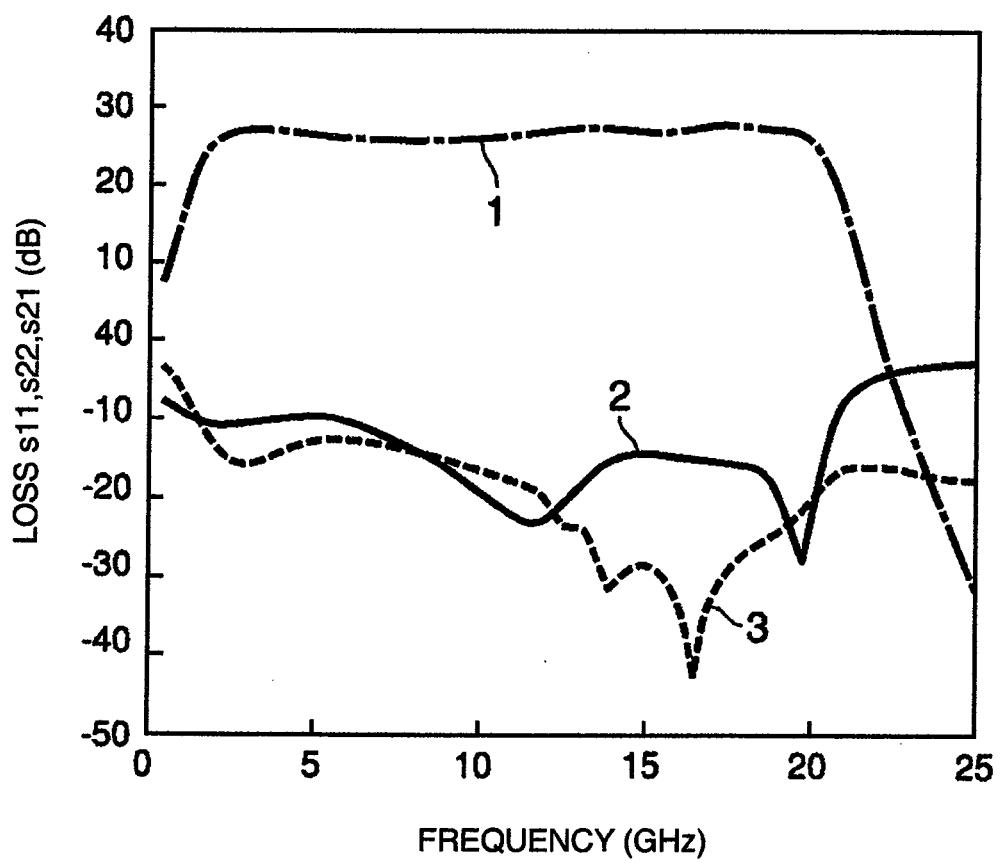
FIG. 6 is a characteristics curve diagram for illustrating transmission characteristics of the radio-frequency wave module according to the second embodiment of the present invention.

FIG. 6 is a diagram where a curve 1 indicates the transmission characteristics between A-B, a curve 2 indicates the input-side reflection characteristics therebetween, and a curve 3 indicates the output-side reflection characteristics therebetween in FIG. 4, i.e., the second embodiment of the radio-frequency wave module to which the present invention is applied. In FIG. 6, the transmission characteristics in the curve 1 exhibit no steep increases in the range of 3 GHz to 20 GHz, and exhibit only a variation of about 2 dB or smaller therein. The input-side reflection characteristics in the curve 2 and the output-side reflection characteristics in the curve 3 also exhibit no steep degradations in the range of 3 GHz to 20 GHz. This characteristics data indicates that the module is in a stable operation.

Figure 7:
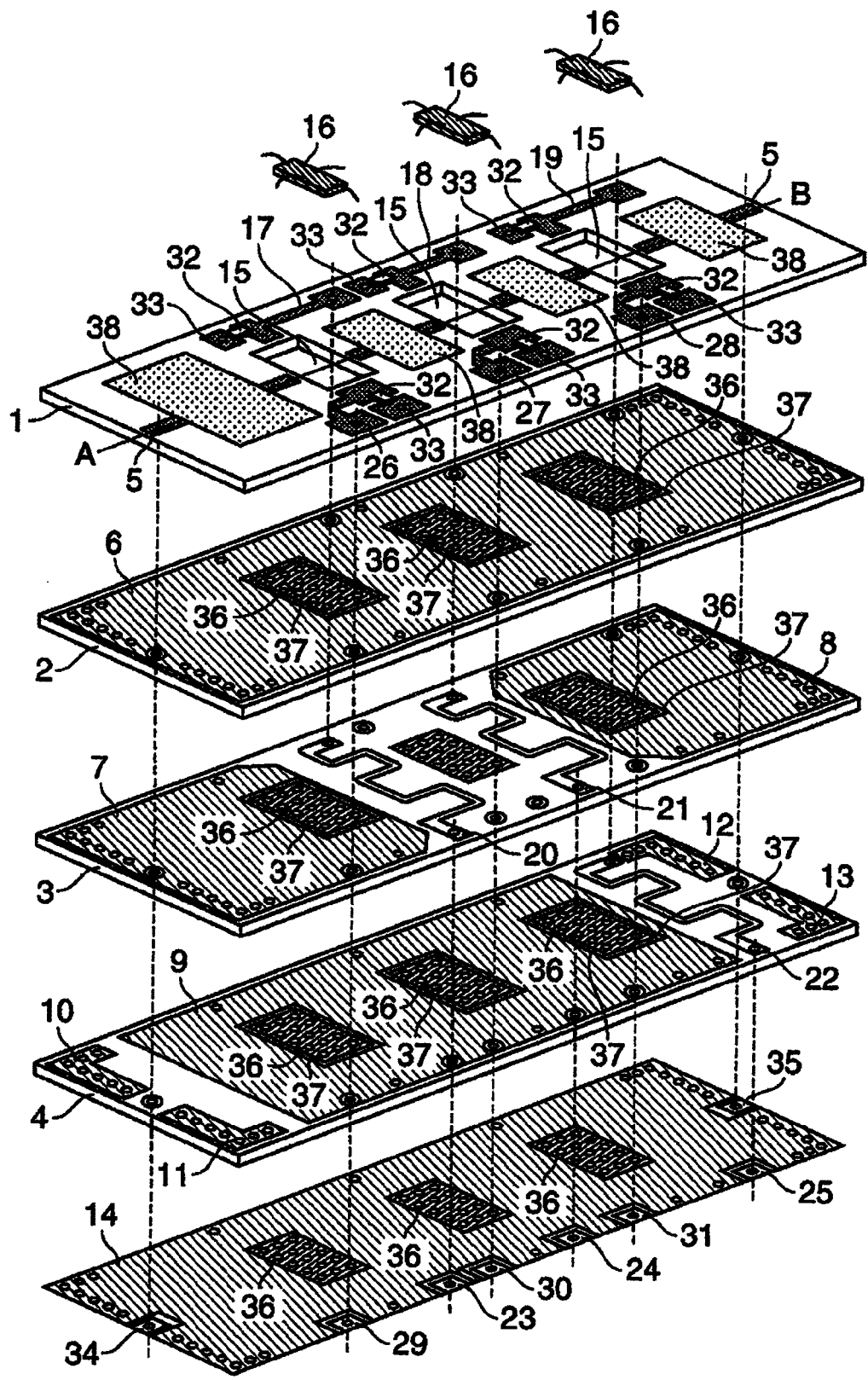
FIG. 7 is an exploded perspective diagram for illustrating a radio-frequency wave module according to a third embodiment of the present invention.

Next, the detailed explanation will be given below concerning a third embodiment of the present invention. FIG. 7 is a structural diagram of a radio-frequency wave module to which the present invention is applied. In FIG. 7, using a four-layer dielectric substrate, the radio-frequency wave module includes the following configuration components: A first-layer dielectric substrate 1, a second-layer dielectric substrate 2, a third-layer dielectric substrate 3, a fourth-layer dielectric substrate 4, metallic conductors 5 of a transmission-path-based distributed parameter element which are formed on the surface of the first-layer dielectric substrate 1 and through which a radio-frequency wave signal is propagated, matching circuits 38 each of which includes a lumped parameter element of a resistor, a capacitor, and an inductor, a grounding-use metallic electrode 6 configuring a transmission-path-based distributed parameter element formed on the second-layer dielectric substrate 2, grounding-use metallic electrodes 7 and 8 formed on the third-layer dielectric substrate 3, grounding-use metallic electrodes 9, 10, 11, 12, and 13 formed on the fourth-layer dielectric substrate 4, a grounding-use metallic electrode 14 formed on the rear surface of the fourth-layer dielectric substrate 4, a plurality of cavity-structured concave portions 15 formed in the first-layer dielectric substrate 1, and semiconductor-including mounted components 16 which are to be contained into the plurality of cavity-structured concave portions 15.

DC-signal-use electrodes 17, 18, and 19 formed on the surface of the first-layer dielectric substrate 1 are connected to metallic electrodes 23, 24, and 25 formed on the rear surface of the fourth-layer dielectric substrate 4 via electrically-conductive through-holes formed on the second-layer dielectric substrate 2 and the fourth-layer dielectric substrate 4 and wiring-use metallic electrodes 20 and 21 formed on the third-layer dielectric substrate 3 and a wiring-use metallic electrode 22 formed on the fourth-layer dielectric substrate 4. DC-signal-use electrodes 26, 27, and 28 formed on the surface of the first-layer dielectric substrate 1 are connected to metallic electrodes 29, 30, and 31 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Also, bypass capacitors 32 configured with chip capacitors and deployed on the first-layer dielectric substrate 1 are connected to grounding-use metallic electrodes 33 formed on the surface of the first-layer dielectric substrate 1. The bypass capacitors 32, then, are connected to the grounding-use metallic electrode 6 formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, and the grounding-use metallic electrode 14 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4.

Moreover, the metallic conductors 5 of the transmission-path-based distributed parameter element, which are formed on the surface of the first-layer dielectric substrate 1 and through which the radio-frequency wave signal is propagated, are connected to metallic electrodes 34 and 35 formed on the rear surface of the fourth-layer dielectric substrate 4 via the electrically-conductive through-holes formed in the second-layer dielectric substrate 2, the third-layer dielectric substrate 3, and the fourth-layer dielectric substrate 4. As a result, the metallic conductors 5 are formed into an input/output terminal structure capable of being connected to the outside.

Here, via the large number of electrically-conductive through-holes 36 formed in the second-layer dielectric substrate 2, the third-layer dielectric substrate 3, and the fourth-layer dielectric substrate 4, the semiconductor-including mounted components 16 which are to be contained into the plurality of cavity-structured concave portions 15 formed in the first-layer dielectric substrate 1 are directly connected to the grounding-use metallic electrode 14 formed on the rear surface of the fourth-layer dielectric substrate 4. However, on account of hollow gaps 37 having a predetermined width and formed in the second-layer dielectric substrate 2, the third-layer dielectric substrate 3, and the fourth-layer dielectric substrate 4, the semiconductor-including mounted components 16 which are to be contained into the plurality of cavity-structured concave portions 15 formed in the first-layer dielectric substrate 1 are not connected to the grounding-use metallic electrode 6 formed on the second-layer dielectric substrate 2, the grounding-use metallic electrodes 7 and 8 formed on the third-layer dielectric substrate 3, and the grounding-use metallic electrode 9 formed on the fourth-layer dielectric substrate 4.

In FIG. 7, set-up values for the configuration components of the radio-frequency wave module are given as follows: Relative dielectric constant and thickness of the first-layer dielectric substrate 1, the second-layer dielectric substrate 2, the third-layer dielectric substrate 3, and the fourth-layer dielectric substrate 4 are 5.6 and 0.15 mm respectively, metallic-conductor width of the metallic conductors 5 of the transmission-path-based distributed parameter element is 0.22 mm, metallic-conductor width of the DC-signal-use electrodes 17, 18, 19, 26, 27, and 28 formed on the surface of the first-layer dielectric substrate 101 is 1.2 mm, metallic-conductor width of the wiring-use metallic electrodes 20 and 21 formed on the third-layer dielectric substrate 3 and the wiring-use metallic electrode 22 formed on the fourth-layer dielectric substrate 4 is 1.2 mm, diameter of the electrically-conductive through-holes connected to the metallic electrodes 23, 24, and 25 formed on the rear surface of the fourth-layer dielectric substrate 4 by way of the DC-signal-use electrodes 17, 18, and 19 formed on the surface of the first-layer dielectric substrate 1, the wiring-use metallic electrodes 20 and 21 formed on the third-layer dielectric substrate 3, and the wiring-use metallic electrode 22 formed on the fourth-layer dielectric substrate 4 is 0.2 mm, diameter of the electrically-conductive through-holes connected to the DC-signal-use electrodes 26, 27, and 28 formed on the surface of the first-layer dielectric substrate 1 and the metallic electrodes 29, 30, and 31 formed on the rear surface of the fourth-layer dielectric substrate 4 is 0.2 mm, diameter of the electrically-conductive through-holes which connect the grounding-use metallic electrode 6 configuring the transmission-path-based distributed parameter element and formed on the second-layer dielectric substrate 2, the grounding-use metallic electrodes 7 and 8 formed on the third-layer dielectric substrate 3, the grounding-use metallic electrodes 9, 10, 11, 12, and 13 formed on the fourth-layer dielectric substrate 4, and the grounding-use metallic electrode 14 formed on the rear surface of the fourth-layer dielectric substrate 4 is 0.2 mm, and the plurality of cavity-structured concave portions 15 formed in the first-layer dielectric substrate 1 for containing the semiconductor-including mounted components 16 therein is 2.8× 2.2 mm. The matching circuits 38 are arbitrary matching circuits for matching the semiconductor-including mounted components 16 with the metallic conductors 5 of the transmission-path-based distributed parameter element, or matching the semiconductor-including mounted components 16 with the semiconductor-including mounted components 16.

Also, on account of the above-described hollow gaps 37 having the predetermined width of 0.2 mm, the grounding-use metallic electrodes formed on the bottom surfaces of the semiconductor-including mounted components 16 which are to be contained into the plurality of cavity-structured concave portions 15 formed in the first-layer dielectric substrate 1 are not connected to the grounding-use metallic electrode 6 formed on the second-layer dielectric substrate 2, the grounding-use metallic electrodes 7 and 8 formed on the third-layer dielectric substrate 3, and the grounding-use metallic electrode 9 formed on the fourth-layer dielectric substrate 4. Accordingly, electrical separation is established between the grounding-use metallic electrode which forms a matching circuit constituted of the distributed parameter element based on the transmission path and a lumped parameter element of the resistor, the capacitor, and the inductor and the grounding-use metallic electrodes which are formed on bottom surfaces of the plurality of cavity-structured concave portions for containing the semiconductor-including mounted components therein.

Figure 8:
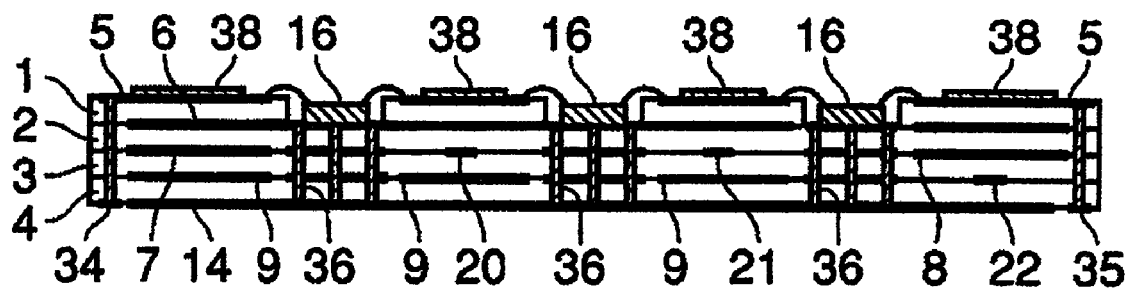
FIG. 8 is a cross-sectional diagram for illustrating the radio-frequency wave module according to the third embodiment of the present invention.
Figure 9:
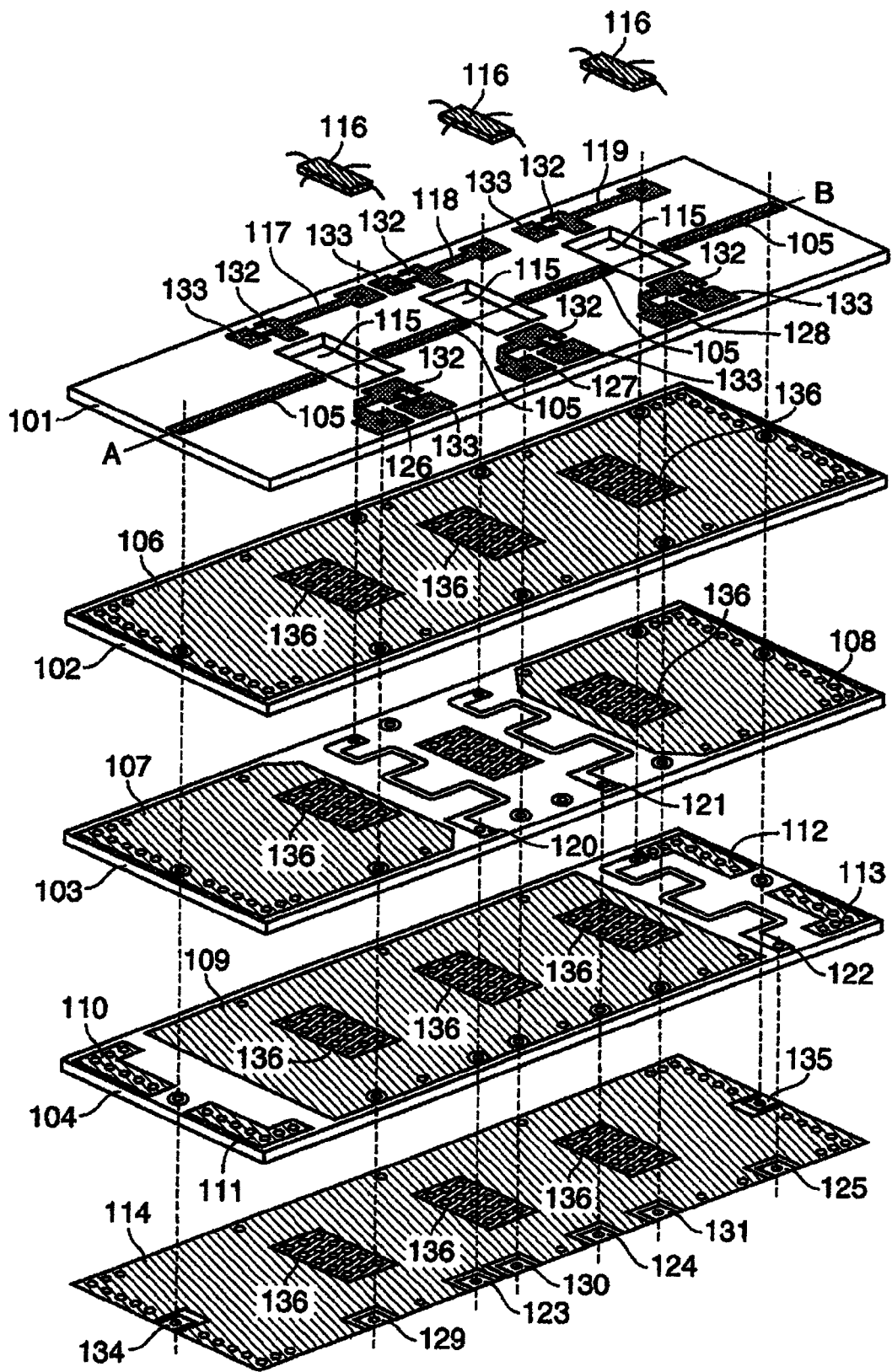
FIG. 9 is the exploded perspective diagram for illustrating the conventional radio-frequency wave module.
Figure 10:
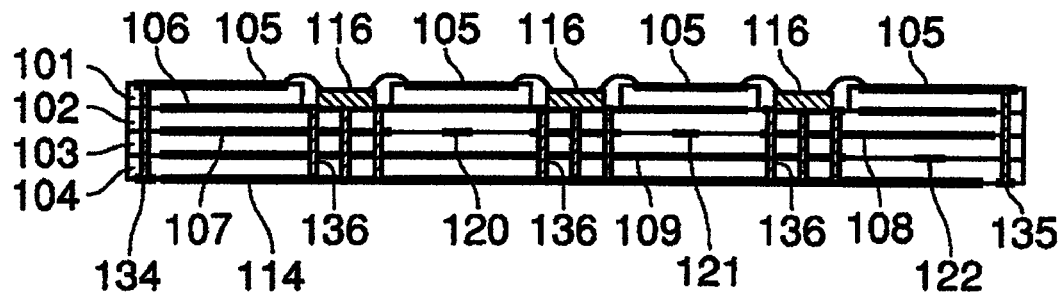
FIG. 10 is the cross-sectional diagram for illustrating the conventional radio-frequency wave module.
Figure 11:
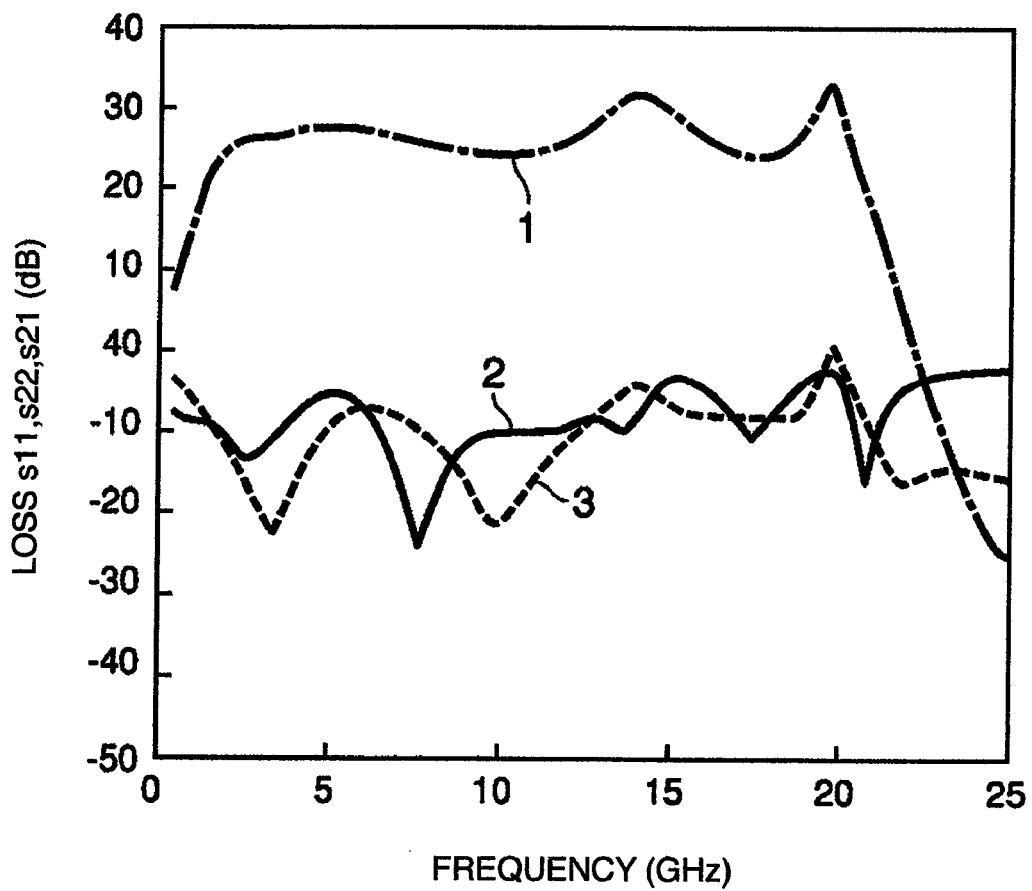
FIG. 11 is the characteristics curve diagram for illustrating the transmission characteristics of the conventional radio-frequency wave module.

FIG. 8 is a cross-sectional schematic diagram of FIG. 7, i.e., the third embodiment of the radio-frequency wave module to which the present invention is applied.

In FIG. 8, the radio-frequency wave module includes the following configuration components: The first-layer dielectric substrate 1, the second-layer dielectric substrate 2, the third-layer dielectric substrate 3, the fourth-layer dielectric substrate 4, the metallic conductors 5 of the transmission-path-based distributed parameter element which are formed on the surface of the first-layer dielectric substrate 1 and through which the radio-frequency wave signal is propagated, the matching circuits 38, the grounding-use metallic electrode 6 configuring the transmission-path-based distributed parameter element formed on the second-layer dielectric substrate 2, the grounding-use metallic electrodes 7 and 8 formed on the third-layer dielectric substrate 3, the grounding-use metallic electrode 9 formed on the fourth-layer dielectric substrate 4, the grounding-use metallic electrode 14 formed on the rear surface of the fourth-layer dielectric substrate 4, the semiconductor-including mounted components 16 which are to be contained into the plurality of cavity-structured concave portions 15 formed in the first-layer dielectric substrate 1, the wiring-use metallic electrodes 20 and 21 formed on the third-layer dielectric substrate 3, and the wiring-use metallic electrode 22 formed on the fourth-layer dielectric substrate 4. The metallic conductors 5 of the transmission-path-based distributed parameter element, which are formed on the surface of the first-layer dielectric substrate 1 and through which the radio-frequency wave signal is propagated, are connected to the metallic electrodes 34 and 35 formed on the rear surface of the fourth-layer dielectric substrate 4 via the electrically-conductive through-holes formed on the second-layer dielectric substrate 2, the third-layer dielectric substrate 3, and the fourth-layer dielectric substrate 4. As a result, the metallic conductors 5 are formed into a structure that enables connection to the outside.

In the third embodiment of the present invention, the four-layer-structured dielectric substrate has been formed in the following manner: The second-layer dielectric substrate 2 on which the grounding-use metallic electrode 6 is formed, the third-layer dielectric substrate 3 on which the wiring-use metallic electrodes 20 and 21 are formed, and the fourth-layer dielectric substrate 4 on which the wiring-use metallic electrode 22 is formed are overlapped with each other under the first-layer dielectric substrate 1 in which the plurality of cavity-structured concave portions 15 are formed, and the grounding-use metallic electrode 14 is formed on the rear surface of the fourth-layer dielectric substrate 4. The layer number of the dielectric substrate, however, is not specifically limited to a particular number such as four.

Incidentally, materials such as glass and ceramics are usable as the materials for the dielectric substrates 1 to 4.

As having been described so far, with respect to the embodiments of the present invention, in a radio-frequency wave package of the radio-frequency wave module including the transmission path based on the distributed parameter element, the transmission path being part of an input/output terminal, the plurality of cavity-structured concave portions for containing the semiconductor-including mounted components therein, the grounding-use metallic electrodes, and the dielectric substrates of at least the two or more layers, the structure is employed where electrical separation is established between the grounding-use metallic electrodes which each form a transmission path based on the distributed parameter element and at least one of grounding-use metallic electrodes which are formed on the bottom surfaces of the plurality of cavity-structured concave portions for containing the semiconductor-including mounted components therein. Alternatively, in a radio-frequency wave package of the radio-frequency wave module including the transmission path based on the distributed parameter element, the transmission path being part of an input/output terminal, the plurality of cavity-structured concave portions for containing the semiconductor-including mounted components therein, the grounding-use metallic electrodes, and the dielectric substrates of at least the two or more layers, a structure is employed where electrical separation is established between the grounding-use metallic electrodes which each form a transmission path based on the distributed parameter element and all of the grounding-use metallic electrodes which are formed on the bottom surfaces of the plurality of cavity-structured concave portions for containing the semiconductor-including mounted components therein.

On account of the employments of these structures, in the radio-frequency wave package of the radio-frequency wave module including the transmission path based on the distributed parameter element, the transmission path being part of the input/output terminal, the plurality of cavity-structured concave portions for containing the semiconductor-including mounted components therein, the grounding-use metallic electrodes, and the dielectric substrate of at least the two or more layers, even if the grounding-use metallic electrodes provided on the respective surfaces and the rear surface of the dielectric substrate of at least the two or more layers are connected to each other via the electrically-conductive through-holes, a radio-frequency wave signal component in the semiconductor-including mounted components, which flows through the grounding-use metallic electrodes formed on the bottom surfaces of the plurality of cavity-structured concave portions for containing the semiconductor-including mounted components therein, does not flow through the grounding-use metallic electrodes provided on the respective surfaces of the dielectric substrate. As a consequence, the structure of the radio-frequency wave module can be converted into the structure which will not give rise to the increase in the resonance or the increase in the loss of the radio-frequency wave signal.

Incidentally, the present invention is not limited to the above-described embodiments with no modifications made thereto, but can be embodied at its carry-out stage by modifying its configuration components within a range of not departing from the spirit of the invention. Also, a variety of inventions can be configured based on an appropriate combination of the plurality of configuration components disclosed in the above-described embodiments. For example, several configuration components may be eliminated from all of the configuration components disclosed in the embodiments. Furthermore, the configuration components according to the different embodiments may be appropriately combined as required.

The invention claimed is:

1. A radio-frequency wave module, comprising:
a transmission path based on a distributed parameter element, said transmission path being part of an input/output terminal;
a plurality of cavity-structured concave portions for containing semiconductor-including mounted components therein;
grounding-use metallic electrodes;
dielectric substrates of at least two or more layers; and
semiconductors; wherein
electrical separation is established between said grounding-use metallic electrodes which each form said transmission path based on said distributed parameter element and at least one or more of said grounding-use metallic electrodes which are formed on bottom surfaces of said plurality of cavity-structured concave portions for containing said semiconductor-including mounted components therein.

2. The radio-frequency wave module according to claim 1, wherein
glass or ceramics is employed as material for said dielectric substrates,
said electrical separation being established between (a) said grounding-use metallic electrodes which each form said transmission path based on said distributed parameter element and (b) at least one of said grounding-use metallic electrodes which are formed on said bottom surfaces of said plurality of cavity-structured concave portions for containing therein said mounted components including at least two or more semiconductors.

3. A radio-frequency wave module, comprising:
a transmission path based on a distributed parameter element, said transmission path being part of an input/output terminal;
a plurality of cavity structured concave portions for containing semiconductor-including mounted components therein;
grounding-use metallic electrodes;
dielectric substrates of at least two or more layers;
said distributed parameter element based on said transmission path;
semiconductors; and
a matching circuit constituted by the distributed parameter element due to the transmission path and a lumped parameter element of a resistor, a capacitor and an inductor, wherein
electrical separation is established between (a) said grounding-use metallic electrodes which each form said matching circuit constituted by the distributed parameter element due to the transmission path and the lumped parameter element of a resistor, a capacitor and an inductor and (b) at least one of said grounding-use metallic electrodes which are formed on bottom surfaces of said plurality of cavity-structured concave portions for containing said semiconductor-including mounted components therein.

4. The radio-frequency wave module according to claim 3, wherein
glass or ceramics is employed as material for said dielectric substrates,
said electrical separation being established between (a) said grounding-use metallic electrodes which each form said matching circuit constituted by the distributed parameter element due to the transmission path and the lumped parameter element of a resistor, a capacitor and an inductor and (b) at least one of said grounding-use metallic electrodes which are formed on bottom surfaces of said plurality of cavity-structured concave portions for containing therein said mounted components including at least one or more semiconductors.

* * * * *